(12) United States Patent
Hefright et al.

(10) Patent No.: US 8,305,225 B2
(45) Date of Patent: Nov. 6, 2012

(54) LED STRIP LIGHT LAMP ASSEMBLY

(75) Inventors: Craig Hefright, Russell, PA (US);
Timothy DiPenti, Russell, PA (US);
Todd Kolstee, North Clymer, NY (US)

(73) Assignee: Truck-Lite Co., LLC, Falconer, NY (US)

( * ) Notice: Subject to any disclaimer, the term of this patent is extended or adjusted under 35 U.S.C. 154(b) by 594 days.

(21) Appl. No.: 11/354,598

(22) Filed: Feb. 14, 2006

(65) Prior Publication Data

US 2006/0202850 A1    Sep. 14, 2006

Related U.S. Application Data

(60) Provisional application No. 60/653,267, filed on Feb. 14, 2005.

(51) Int. Cl.
G08B 5/22    (2006.01)

(52) U.S. Cl. ............... 340/815.45; 340/15.49; 362/459; 362/487; 362/545

(58) Field of Classification Search ......... 340/815.45–815.74, 693.5; 362/362, 362/253, 459, 487, 498, 545, 546; 315/159
See application file for complete search history.

(56) References Cited

U.S. PATENT DOCUMENTS

| | | | |
|---|---|---|---|
| 4,999,755 A | 3/1991 | Lin | 362/250 |
| 5,607,227 A | 3/1997 | Yasumoto et al. | 362/249 |
| 5,655,830 A | 8/1997 | Ruskouski | 362/240 |
| 5,783,909 A | 7/1998 | Hochstein | 315/159 |
| 5,833,355 A | 11/1998 | You et al. | 362/244 |
| 5,857,767 A * | 1/1999 | Hochstein | 362/294 |
| 6,045,240 A | 4/2000 | Hochstein | 362/294 |
| 6,059,414 A * | 5/2000 | Tsai | 359/516 |
| 6,074,074 A * | 6/2000 | Marcus | 362/240 |
| 6,078,148 A | 6/2000 | Hochstein | 315/291 |
| 6,157,117 A | 12/2000 | Taylor | 313/318.01 |
| 6,158,882 A | 12/2000 | Bischoff, Jr. | 362/488 |
| 6,188,527 B1 | 2/2001 | Bohn | 359/710 |
| 6,203,180 B1 | 3/2001 | Flieschmann | 362/471 |
| 6,252,500 B1 * | 6/2001 | Chueh et al. | 340/472 |
| 6,283,612 B1 | 9/2001 | Hunter | 362/420 |
| 6,347,880 B1 * | 2/2002 | Furst et al. | 362/494 |
| 6,354,714 B1 * | 3/2002 | Rhodes | 362/153.1 |
| 6,361,186 B1 | 3/2002 | Slayden | 362/249 |
| 6,361,190 B1 | 3/2002 | McDermott | 362/310 |
| 6,371,637 B1 | 4/2002 | Atchinson et al. | 362/555 |
| 6,411,022 B1 | 6/2002 | Machida | 313/318.1 |
| 6,416,200 B1 * | 7/2002 | George | 362/146 |
| 6,428,189 B1 | 8/2002 | Hochstein | 362/373 |
| 6,472,823 B2 | 10/2002 | Yen | 315/112 |
| 6,478,449 B2 | 11/2002 | Lee et al. | 362/249 |
| 6,517,218 B2 | 2/2003 | Hochstein | 362/294 |
| 6,536,915 B1 | 3/2003 | Chang | 362/246 |
| 6,566,824 B2 | 5/2003 | Panagotacos et al. | 315/291 |

(Continued)

*Primary Examiner* — Brent Swarthout
(74) *Attorney, Agent, or Firm* — The Bilicki Law Firm, P.C.

(57) ABSTRACT

A lamp assembly to be incorporated into or positioned on a truck's existing support structure comprising: a heat sink; an electrically insulating dielectric coating disposed on the heat sink; a plurality of circuit traces disposed on the dielectric coating; a plurality of LEDs disposed on and electrically connected to one another by the dielectric coating; and a cover disposed substantially over and protecting the heat sink, the dielectric coating, the circuit traces, and the LEDs. The LEDs are spaced apart at intervals to provide general illumination. The cover can be clear or be solid and have a plurality of apertures, each corresponding to one LED, and can further include a lens over the apertures.

56 Claims, 10 Drawing Sheets

U.S. PATENT DOCUMENTS

| | | | |
|---|---|---|---|
| 6,573,536 B1 | 6/2003 | Dry | 257/88 |
| 6,582,100 B1 | 6/2003 | Hochstein et al. | 362/294 |
| 6,583,550 B2 | 6/2003 | Iwasa et al. | 313/485 |
| 6,592,238 B2 | 7/2003 | Cleaver et al. | 362/249 |
| 6,601,971 B1 | 8/2003 | Ko | 362/219 |
| 6,609,804 B2 | 8/2003 | Nolan et al. | 362/20 |
| 6,612,717 B2 | 9/2003 | Yen | 362/245 |
| 6,617,520 B1 | 9/2003 | Martter et al. | 174/255 |
| 6,720,784 B2 | 4/2004 | Martter et al. | 324/760 |
| 6,866,406 B1 * | 3/2005 | Starkey et al. | 362/501 |
| 7,134,772 B2 * | 11/2006 | Furuya et al. | 362/494 |
| 2002/0145392 A1 | 10/2002 | Hair, III et al. | 315/470 |
| 2002/0159270 A1 * | 10/2002 | Lynam et al. | 362/492 |
| 2003/0048641 A1 | 3/2003 | Alexanderson et al. | 362/470 |
| 2003/0102810 A1 | 6/2003 | Cross et al. | 315/470 |
| 2003/0179585 A1 | 9/2003 | Lefebvre | 362/470 |
| 2004/0156210 A1 * | 8/2004 | Pederson | 362/545 |
| 2004/0169522 A1 | 9/2004 | Martter et al. | 324/760 |

* cited by examiner

LED STRIP LIGHT LAMP ASSEMBLY

This application claims priority to U.S. Provisional Patent Application, Ser. No. 60/653,267 filed Feb. 14, 2005.

FIELD OF INVENTION

The present invention relates generally to a lighting system. Specifically, the present invention relates to a low profile light emitting diode strip designed to be integrated directly into the support structure of a truck to provide general illumination.

DETAILED DESCRIPTION OF EMBODIMENTS OF THE INVENTION

For the purpose of promoting an understanding of the LED strip light lamp assembly, reference will be made to embodiments of an LED strip light lamp assembly, as illustrated by the following drawings. It will nevertheless be understood that no limitations on the scope of the invention are thereby intended by such alterations as changing the geometry or any element of the embodiments of the invention, the placement of the various components, the quantity of each component, or the materials from which to make the various components. It is contemplated that such alterations fall within the spirit and scope of the invention described herein. Some of the possible alterations will be mentioned in the following description.

With particular reference to the drawings, the reader should understand that like numerals in different figures refer to the same elements of the various embodiments.

Figure 1:
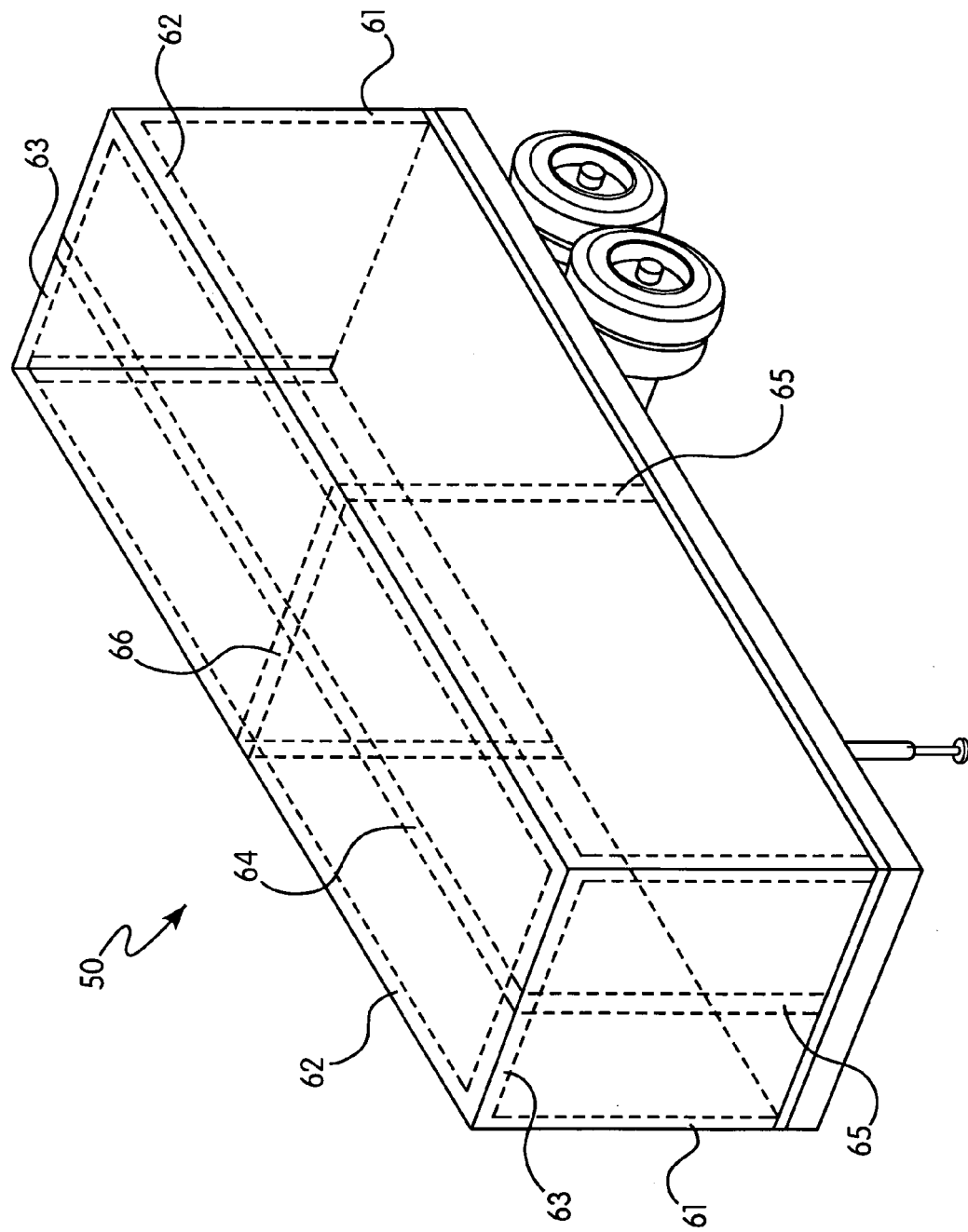
FIG. 1 shows a top perspective view of an exemplary truck trailer, the support structure within the truck trailer, and some of the possible positionings of the light emitting diode (LED) strip light lamp assembly.

FIG. 1 shows a top perspective view of an exemplary truck trailer 50 and the trailer support structure comprised of structural elements 61, 62, 63, 64, 65, and 66 within truck trailer 50 to illustrate some of the possible positionings of the light emitting diode strip light lamp assembly (not shown) within truck trailer 50. As discussed in greater detail infra, the LED strip light lamp assembly is secured to or at least partially within the trailer support structure to provide general illumination within truck trailer 50. The trailer support structure is comprised of, in this embodiment of truck trailer 50, four (4) vertical structural elements 61 at the corners of truck trailer 50, two (2) lateral structural elements 62 which run the length of truck trailer 50 along the roof of truck trailer 50 where the roof and sides meet, and two (2) lateral structural elements 63 which run the width of truck trailer 50 along the roof of truck trailer 50 where the roof meets the front and back of truck trailer 50. In addition, the truck support structure can further be comprised of one or more additional vertical structural elements 65 positioned along each side wall or front wall of truck trailer 50, one or more additional lateral structural elements 64 running along the length of the roof of truck trailer 50, and/or one or more additional lateral structural elements 66 running across the width of the roof of truck trailer 50.

The light emitting diode strip light lamp assembly is positioned on or at least partially within one or more of structural elements 61, 62, 63, 64, 65, and 66 and connected to the truck's power supply (not shown) in any conventional manner. The customer generally establishes the level of illumination required since no legal requirements exist for interior lighting. However, the Technology and Maintenance Council (TMC) part of the American Trucking Association (ATA) has recommended some guidelines that establish minimum photometric performance of interior lighting systems. The Illuminating Engineering Society of North America (IES) also has recommended lighting levels for various tasks. The recommendations vary depending on the person's age and the task to be performed. For example, for general reading, 200 Lux is recommended; for walking and moving about approximately 100 Lux is recommended; and for just looking for an object on the floor of a vehicle 50 Lux is recommended. Lux is a unit of luminous incidence or luminance equal to one lumen per square meter. The LED strip light lamp assembly of the present invention can be constructed to meet or exceed any of the recommended guidelines, as provided in greater detail infra.

Figure 2:
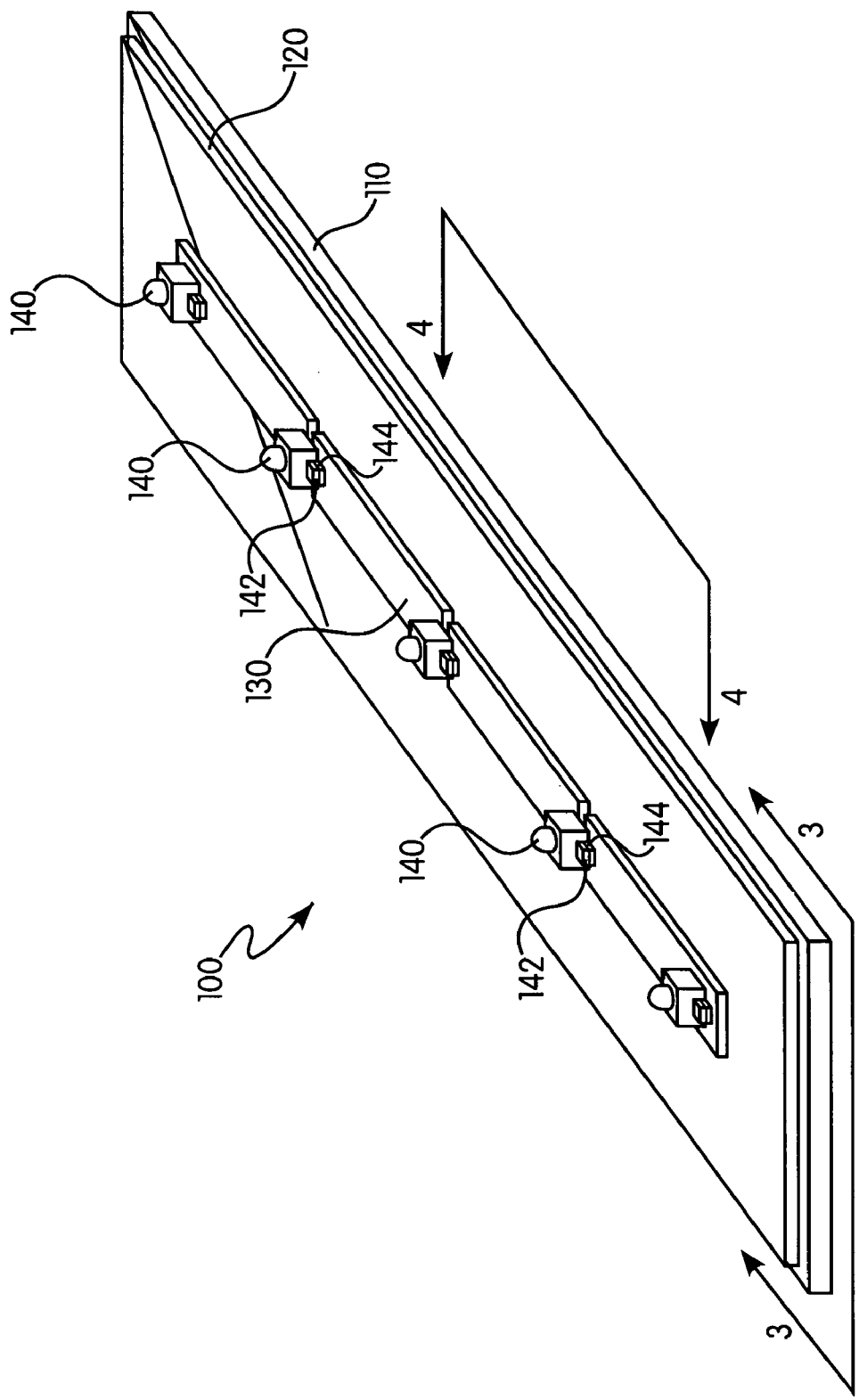
FIG. 2 shows a top perspective view of one embodiment of the LED strip light lamp assembly, without a cover.

FIG. 2 shows a top perspective view of one embodiment of LED strip light lamp assembly 100 (without a cover). In the embodiment shown, LED strip light lamp assembly 100 is constructed per U.S. Pat. No. 5,857,767 (Hochstein '767, incorporated herein in its entirety) and comprised of heat sink 110, an electrically insulating dielectric coating 120, circuit traces 130, and LEDs 140. Heat sink 110 is made of a thermally and electrically conductive metal. In the embodiment shown, heat sink 110 is made of solid aluminum. However, heat sink 110 can be made of another thermally and electrically conductive metal such as an aluminum alloy, steel, copper, stainless steel, and combinations thereof.

Dielectric coating 120 is disposed over heat sink 110. In one embodiment, dielectric coating 120 is disposed only over predetermined routes, connecting each LED 140. However, dielectric coating 120 can also be disposed over the entire surface, or essentially the entire surface, of heat sink 110, as shown in FIG. 2. Dielectric coating 120 may be less than one thousand (1,000) microns thick and greater than ten (10) microns thick. In the embodiment shown, dielectric coating 120 is between one hundred (100) and three hundred (300) microns thick. In the embodiment shown, dielectric coating 120 is applied with a thixotropic material by screen printing. In alternate embodiments, dielectric coating 120 is applied to heat sink 110 by dipping heat sink 110 into a liquid material or sprayed on, and then allowed to cure. Dielectric coating 120 can be made of any electrically insulating material with low thermal impedance, for example, a polymer/ceramic blend.

Circuit traces 130 are disposed on dielectric coating 120, or along the route for an embodiment in which dielectric coating 120 is disposed only over predetermined routes. Circuit traces 130 are printed on dielectric coating 120 or along the routes to establish discrete and electrically conductive paths for electrically connecting LEDs 140. In the embodiment shown, circuit traces 130 consist of a polymeric material having metal particles dispersed therein, such as an epoxy compounded with a noble metal, e.g., silver, gold, alloys thereof, or a phenolic resin compounded with either copper, silver, or nickel. Disposed on circuit traces 130 are LEDs 140, described in detail with respect to FIG. 3.

In one embodiment, LED strip light lamp assembly 100 is produced as four (4) foot strips. LED strip light lamp assembly 100 is electrically is connected to the truck's power source and multiple LED strip light lamp assemblies can be electrically connected to each other. In another embodiment, LED strip light lamp assembly 100 is produced according to the process taught in U.S. Pat. No. 6,617,520 (Martter '520, incorporated herein in its entirety). In this embodiment, LED strip light lamp assembly 100 uses a porcelain enameled metal substrate with an external electrical conductor connected to LEDs 140. LED strip light lamp assembly 100 constructed using the Martter '520 method is generally made in a length up to two (2) feet. However, one of ordinary skill in the art will recognize that the length of the strip is not intended to be limiting. Rather any length of LED strip light lamp assembly 100 can be employed.

Figure 3:
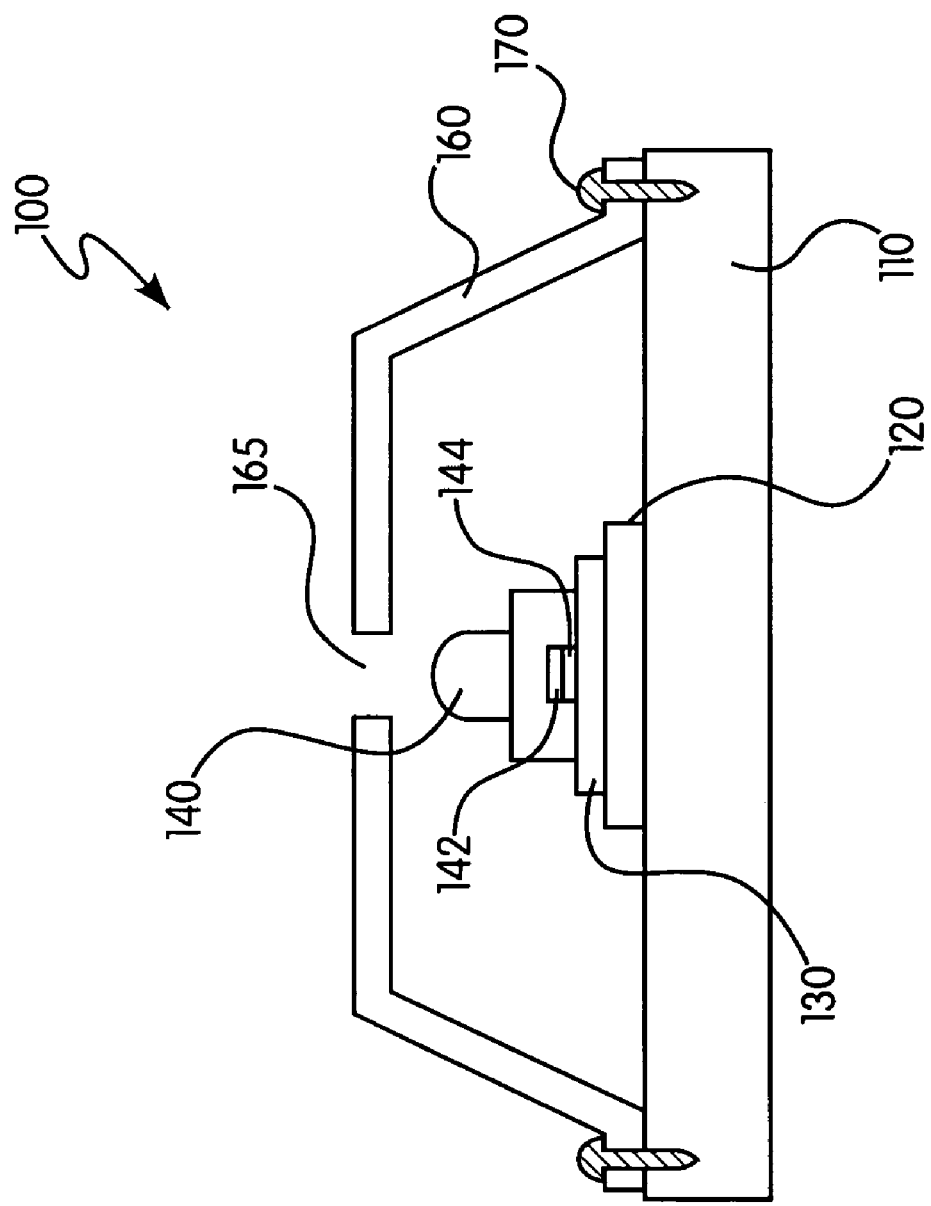
FIG. 3 shows a front view of the embodiment of the LED strip light lamp assembly of FIG. 2, including the cover, taken along line 3-3 of FIG. 2.

FIG. 3 shows a front view of one embodiment of LED strip light assembly 100, taken along line 3-3 of FIG. 2. In the embodiment shown, LEDs 140 are Luxeon® 1W emitter diodes from Lumileds®. In alternate embodiments, LEDs 140 may be, but are not limited to, Luxeon® 3W emitter diodes from Lumileds®, 1W Jupiter™ diodes from Nichia Corp.®, 1W XLamp™ diodes from Cree, Inc.®, and 1W Golden Dragon™ diodes from Osram GmbH®.

In the embodiment shown, LEDs 140 are further comprised of leads 142. Leads 142 are adhesively secured to circuit traces 130 via adhesive 144, which is electrically and thermally conductive, in accordance with the procedure of Hochstein '767. In addition, other electrically-conductive securing mechanisms for securing leads 142 to circuit traces 130 well-known to those of ordinary skill in the art could be employed.

Also visible in FIG. 3 is cover 160. Cover 160 substantially is encases LEDs 40 to protect them from damage, while maintaining a low profile. Cover 160 is secured to heat sink 110 via any means commonly known in the art, including, but not limited to screws 170 (as in the embodiment shown in FIG. 3), fasteners, an adhesive or epoxy, a mechanical engagement such as a snap fit, interference fit, or locking mechanism between two extruded shapes, and the like. In the embodiment shown in FIG. 3, cover 160 is made of a substantially clear plastic, polycarbonate or acrylic. Cover 160 is further comprised of a plurality of apertures 165, each aperture corresponding to one (1) LED 140. Aperture 165 allows light emitted from LED 140 to illuminate the inside of truck trailer 50, while still permitting cover 160 to protect LED 140 from damage. In an alternate embodiment of LED strip light lamp assembly 100, cover 160 includes a single aperture 165 that is elongated to allow light to pass through from multiple LEDs 140. In yet another alternate embodiment, cover 160 is further comprised of a clear protective layer over apertures 165 to provide further protection of LEDs 140. In a further alternate embodiment, a lens could be added within cover 160 so that the light is redirected to be more evenly distributed as it passes through apertures 165.

Figure 4:
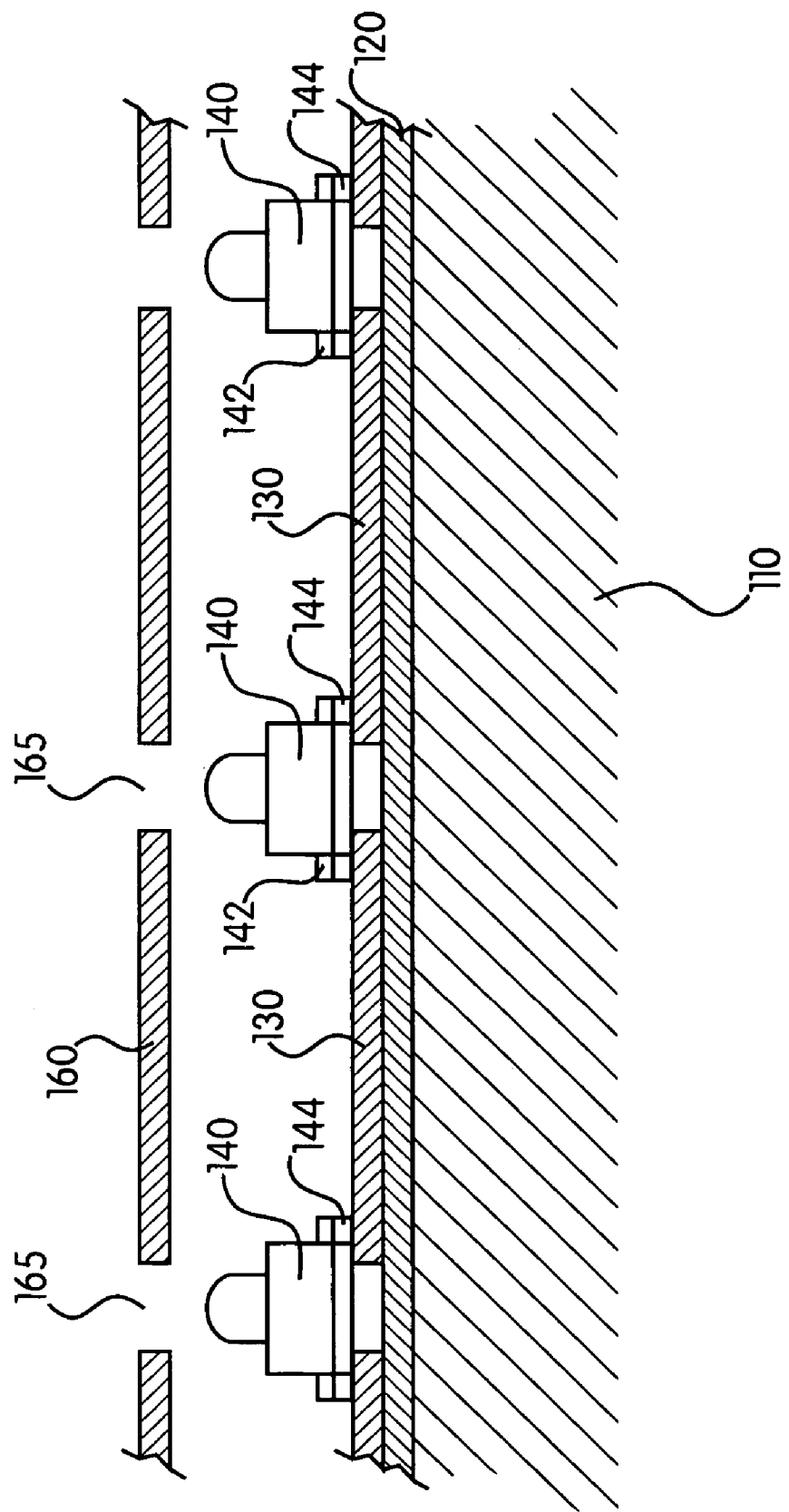
FIG. 4 shows a side plan view of the embodiment of the LED strip light lamp assembly of FIG. 2, including the cover, taken along line 4-4 of FIG. 2.

FIG. 4 shows a side view of one embodiment of LED strip light lamp assembly 100, including cover 160, taken along line 4-4 of FIG. 2. As discussed above, each LED 140 has a corresponding aperture 165 in cover 160 to permit light to be emitted from LED strip light lamp assembly 100 for general illumination purposes of the truck trailer 50. Although not drawn to scale, in the embodiment shown, each LED 140 is one (1) inch from the other LED 140, as measured from the center of each LED 140. In such a construction, low power ⅛ W HPA Superflux® LEDs are used.

In one embodiment, each LED 140 is spaced from each adjacent LED 140 by approximately one (1) to six (6) inches, as measured from the center of each LED 140. In such a construction, high power 1W LEDs are used. This range of spacing between each LED 140 provides for general illumination of the truck trailer without forming any hot and/or cold spots, i.e., areas of relatively high illumination and relatively low illumination, respectively. In an alternate embodiment, LED strip light lamp assembly 100 can be comprised of multiple lines of LEDs 140. In such an embodiment, LED strip light lamp assembly 100 can further be comprised of circuitry that energizes only a portion of LEDs 140. For example, LED strip light lamp assembly 100 can be further comprised of a low switch that illuminates half of LEDs 140 and a high switch that illuminates all LEDs 140.

In an alternate embodiment, each LED strip light lamp assembly 100 is constructed in four (4) foot sections and placed in series along one or more of structural elements 61-66. Each four-foot section contains twelve (12) evenly spaced apart LEDs 140. However, the specific placement and spacing of LEDs 140 is not intended to be limiting. As shown in FIGS. 5d and 5f, LED strip light lamp assembly 100 is placed perpendicular to the length of truck trailer 50. Multiple LED strip light lamp assemblies 100 can be placed parallel to one another along the length of the truck trailer as well.

LED strip light lamp assembly 100 may be mounted within the support structure of truck trailer 50, thus using existing support structure within truck trailer 50 to support LED strip light lamp assemblies 100. In this embodiment, one or more structural elements 61-66 of support structure are removed, LED strip light lamp assembly 100 is installed within truck trailer 50, and apertures 165 are cut directly into one or more structural elements 61-66 of the support structure such that one or more structural elements 61-66 act as cover 160. In an alternate embodiment, portions of structural elements 61-66 of the support structure are cut away and LED strip light lamp assembly 100, including cover 160 with apertures 165 is inserted into the opening, thereby providing an illumination system with little or no profile. In still another alternate embodiment, LED strip light lamp assembly 100 is secured to an outside of structural elements 61-66 of the support structure. In such an embodiment, cover 160 with apertures 165 would protrude into the truck trailer, forming LED strip light lamp assembly 100 with a small profile. In yet another embodiment, LED strip light lamp assembly 100 is covered by a generally clear plastic, rather than by cover 160, to provide protection to LEDs 140 as well as permit light to enter into truck trailer 50.

As discussed above, LED strip light lamp assembly 100 can be mounted in or onto any structural element 61-66 of the trailer support structure. FIGS. 5a through 5f show the illumination patterns for various embodiments and positionings of LED strip light lamp assembly 100. Each figure shows the test results of a photometric lamp test using a dark enclosed room with a high ceiling height. The test simulates one quarter of a fifty-three (53) foot trailer. Test area 200 is thirteen feet, three inches by eight feet, six inches (13'3"×8'6") and LED strip light lamp assembly 10 is positioned eight feet, nine inches above the floor (8'9"). Lux readings were taken at seventeen (17) different positions. Position 1 is at the top left corner of test area 200; Position 3 is at the bottom left corner of test area 200; Position 2 is along the leftmost side of test area 200, midway between Positions 1 and 3; Position 4 is three feet, three and three quarter inches (3'3¾") to the right of and two feet one and one half inches (2'1½") down from Position 1; Position 6 is three feet, three and three quarter inches (3'3¾") to the right of and two feet, one and one half inches (2'1½") up from Position 3; Position 5 is midway between Positions 4 and 6; Position 7 is midway along the length of the top of test area 200, i.e., six feet, seven and one half inches (6'7½") to the right of Position 1; Position 9 is immediately under the center of LED strip light lamp assembly 100 and at the center of test area 200; Position 11 is midway along the length of the bottom of test area 200, i.e., six feet, seven and one half inches (6'7½") to the right of Position 3; Position 8 is midway between Positions 7 and 9; Position 10 is midway between Positions 9 and 11; Position 15 is at the top right corner of test area 200; Position 17 is at the bottom right of test area 200; Position 16 is along the rightmost side of test area 200, midway between Positions 15 and 17; Position 12 is three feet, three and three quarter inches (3'3¾") to the left of and two feet, one and one half inches (2'1½") down from Position 15; Position 14 is three feet, three and three quarter inches (3'3¾") to the left of and two feet, one and one half inches (2'1½") Up from Position 17; and Position 13 is midway between Positions 12 and 14.

Figure 5A:
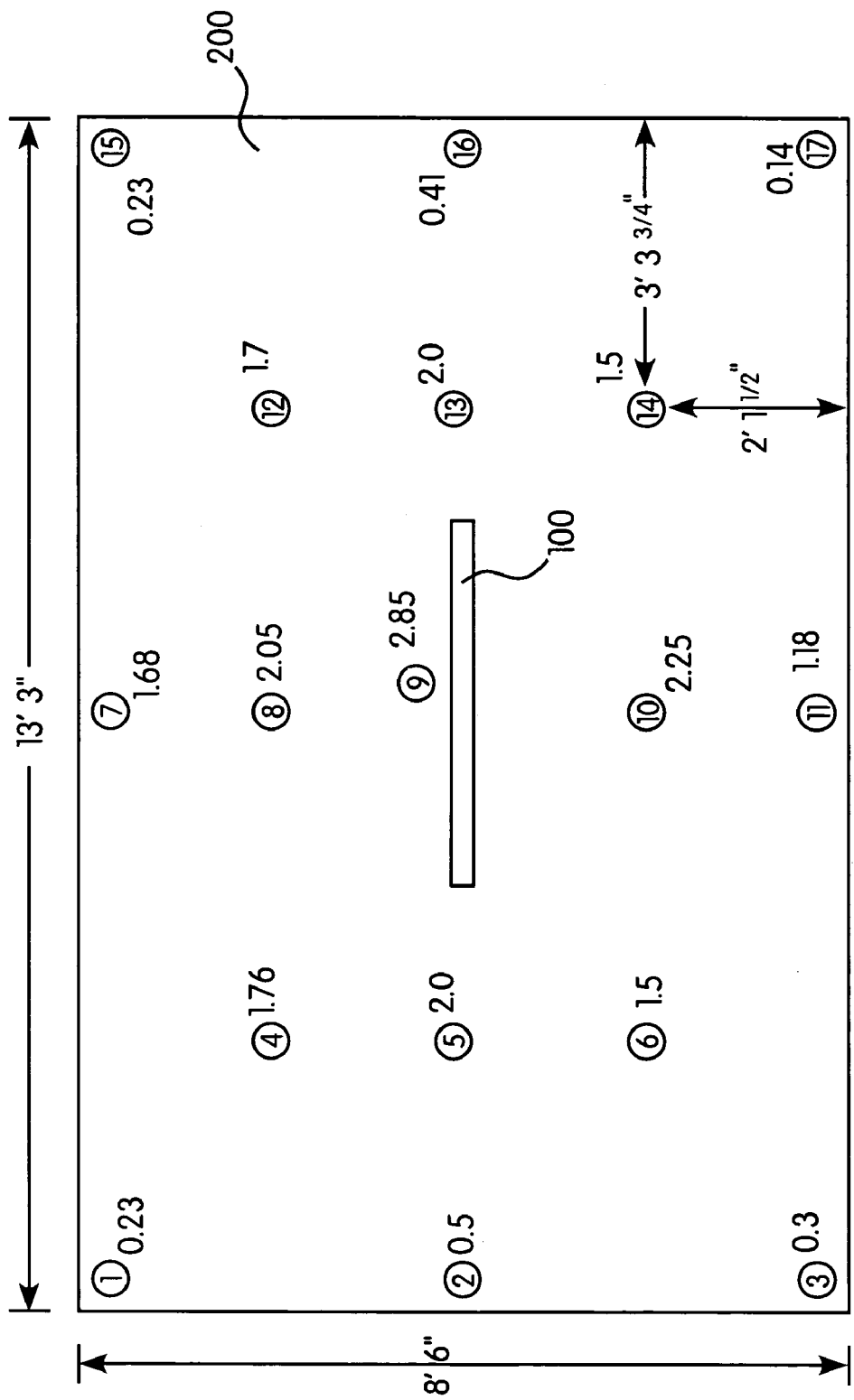
FIGS. 5a through 5f show the illumination patterns of a test area simulating a portion of a truck trailer for various embodiments and positionings of the LED strip light lamp assembly.
Figure 5B:
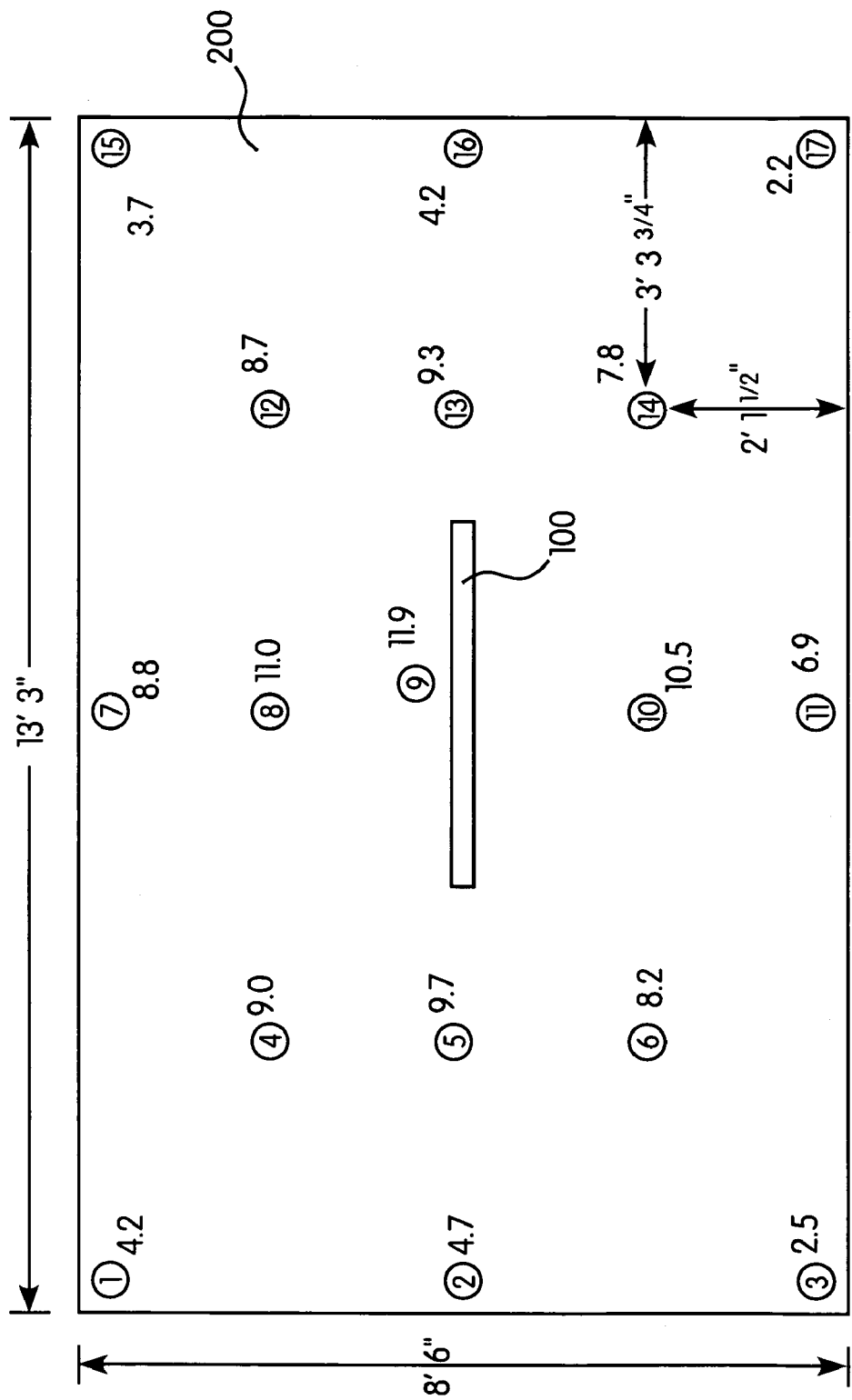
Figure 5C:
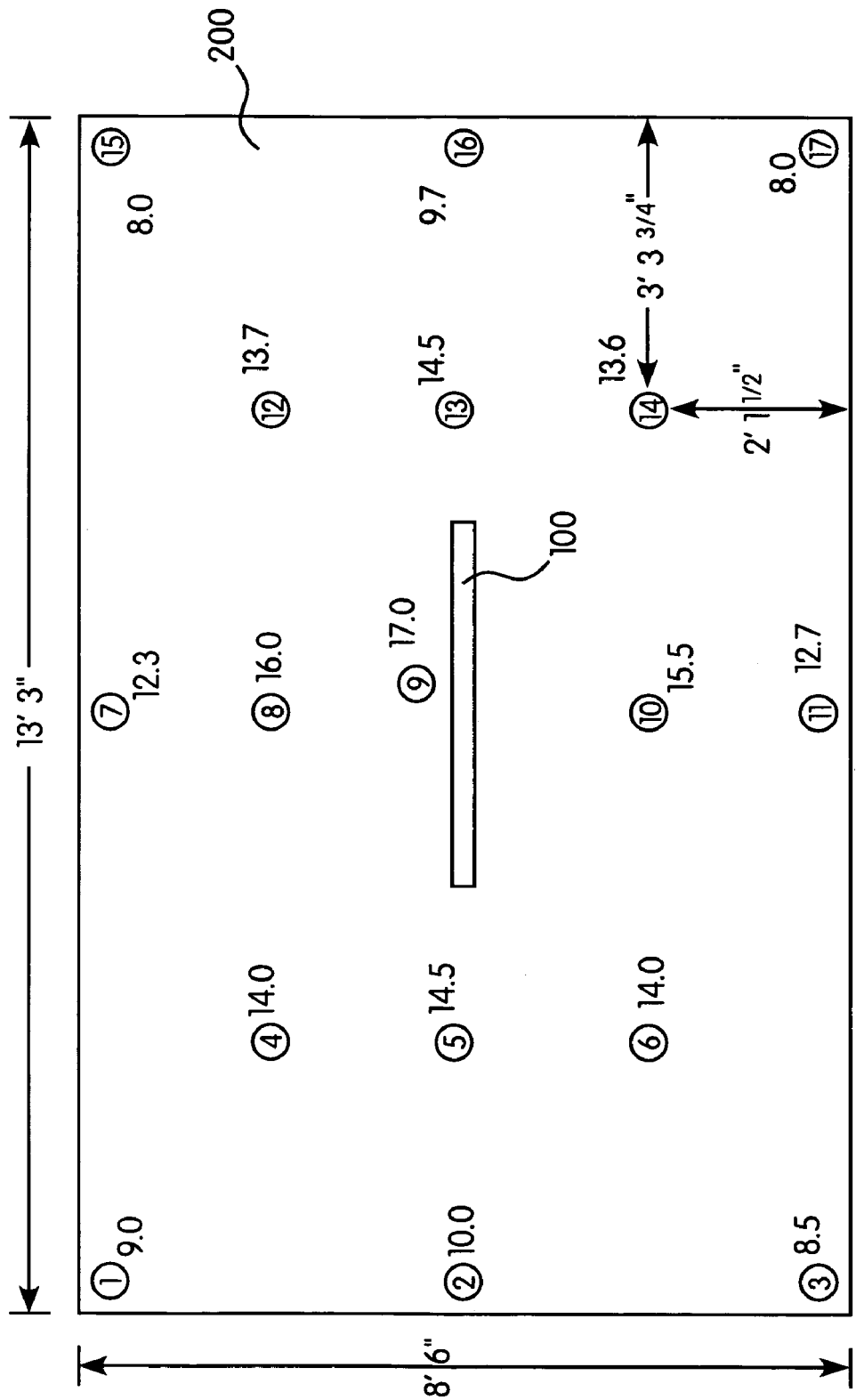
Figure 5D:
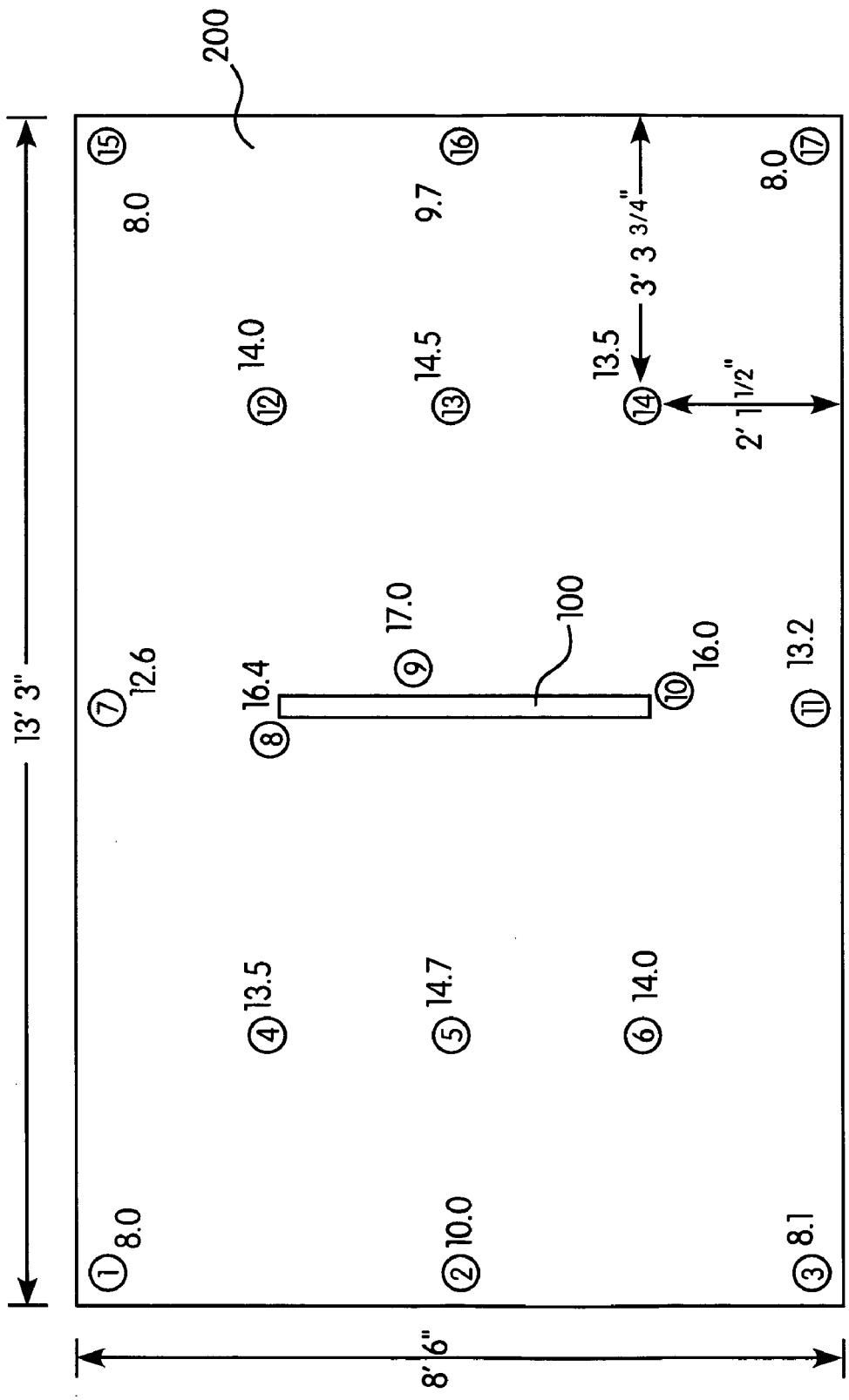
Figure 5E:
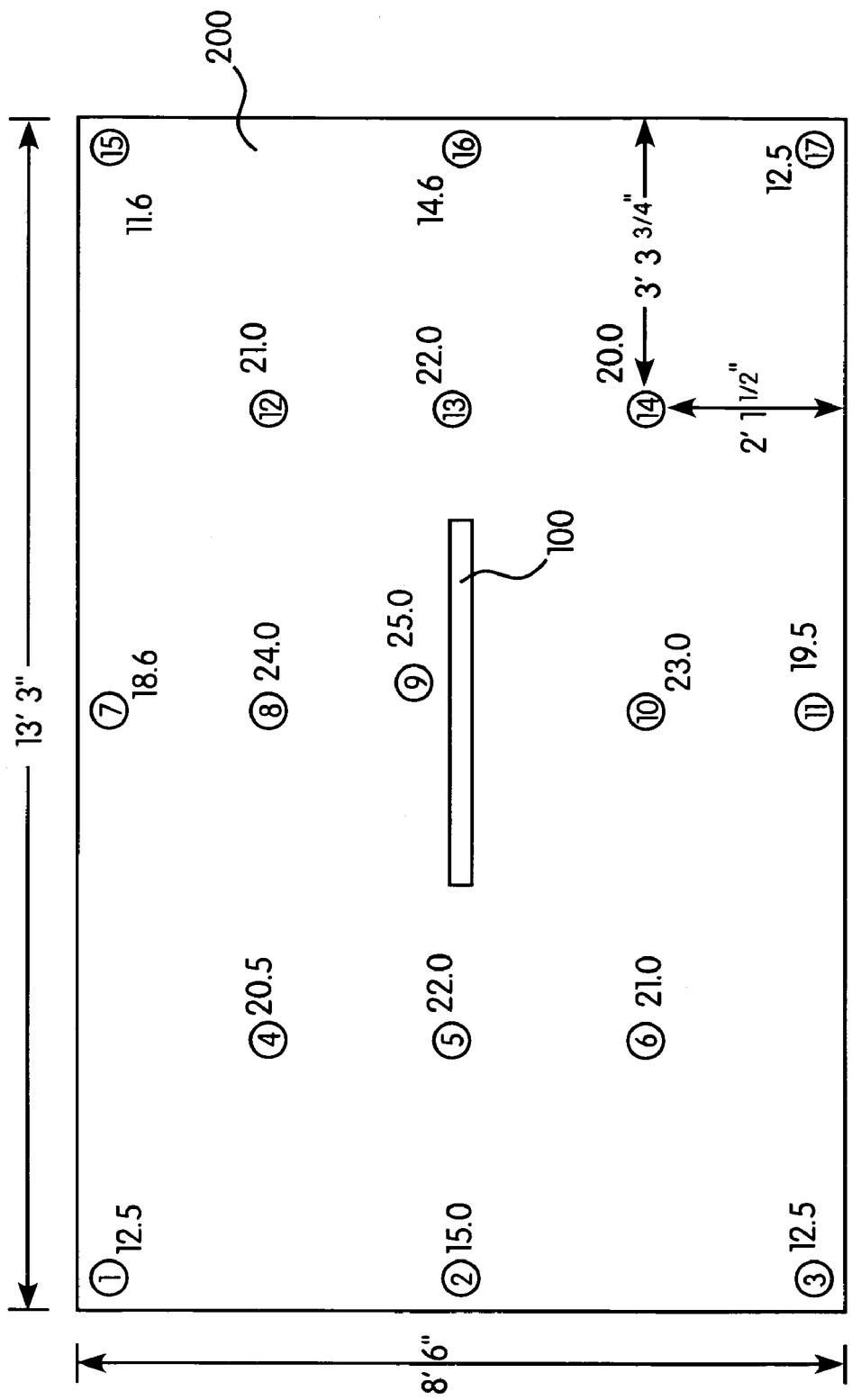
Figure 5F:
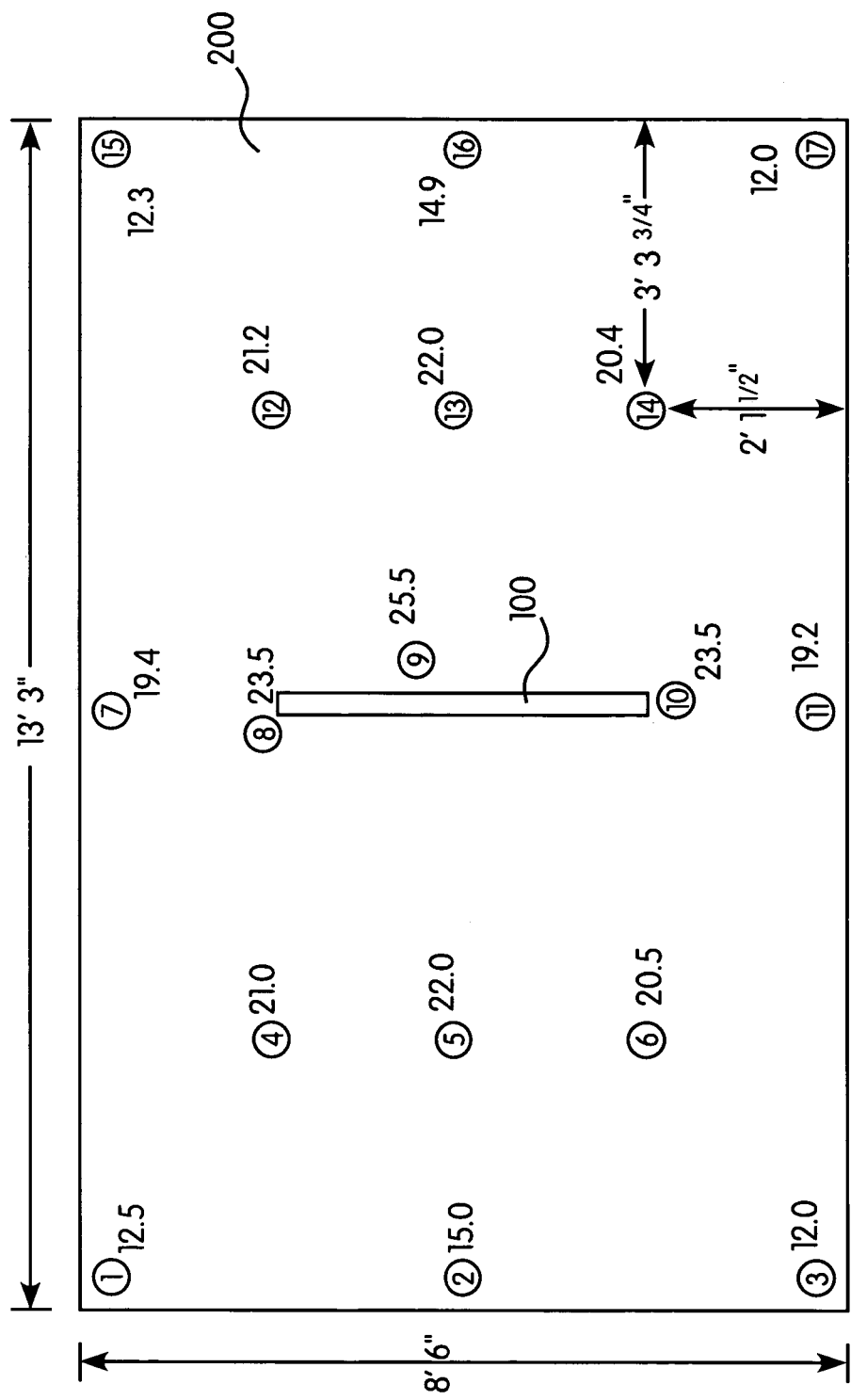

FIG. 5a is the resultant light pattern from a test performed on a four foot (4') LED strip light lamp assembly 100 using fifteen (15) HPA ⅛W Super-Flux LEDs with LED strip light lamp assembly 100 positioned parallel to the length of test area 200. FIG. 5b is the resultant light pattern from a test performed on a four foot (4') LED strip light lamp assembly 100 using forty-eight (48) HPA ⅛W Super-Flux LEDs positioned parallel to the length of test area 200. FIG. 5c is the resultant pattern from a test performed on a four foot (4') LED strip light lamp assembly 100 using twelve (12) 1W Golden Dragon LEDs positioned parallel to the length of test area 200. FIG. 5d is the resultant pattern from a test performed on a four foot (4') LED strip light lamp assembly 100 using twelve (12) 1W Golden Dragon LEDs positioned perpendicular to the length of test area 200. FIG. 5e is the resultant pattern from a test performed on a four foot (4') LED strip light lamp assembly 100 using twelve (12) 1W Luxeon LEDs positioned parallel to the length of test area 200. FIG. 5f is the resultant pattern from a test performed on a four foot (4') LED strip light lamp assembly 100 using twelve (12) 1W Luxeon LEDs positioned perpendicular to the length of test area 200.

The following chart summarizes a portion of the test results, including the brightest spot for each test as well as the average luminosity throughout test area 200 (average of Lux readings at 17 positions):

| Lamp Tested | Center Bright Spot (Lux) | Average Lux |
|---|---|---|
| 4 ft. assembly with 15 HPA ⅛ W Super-Flux LEDs (see FIG. 5a) | 2.85 | 1.31 |
| 4 ft. assembly with 48 HPA ⅛ W Super-Flux LEDs (see FIG. 5b) | 11.9 | 7.2 |
| 4 ft. assembly with 12 1 W Golden Dragon LEDs -parallel to length of test area (see FIG. 5c) | 17.0 | 12.4 |
| 4 ft. assembly with 12 1 W Golden Dragon LEDs- perpendicular to length of test area (see FIG. 5d) | 17.0 | 12.4 |
| 4 ft. assembly with 12 1 W Luxeon LEDs- parallel to length of test area (see FIG. 5e) | 25.0 | 18.5 |
| 4 ft. assembly with 12 1 W Luxeon LEDs- perpendicular to length of test area (see FIG. 5f) | 25.5 | 18.6 |

While several embodiments of the present invention have been shown and described, it is to be understood that the invention is not limited thereto, but is susceptible to numerous changes and modifications as known to a person skilled in the art, and it is intended that the present invention not be limited to the details shown and described herein, but rather cover all such changes and modifications as are obvious to one of ordinary skill in the art.

What is claimed is:

1. A low profile lamp assembly at least partially housed within a vehicular support structure for illuminating with minimal glare an interior space at least partially defined by said support structure, said lamp assembly comprising:
   a heat sink;
   an electrically insulating dielectric coating disposed on said heat sink;
   a plurality of circuit traces disposed on said dielectric coating;
   a plurality of light emitting diodes spaced apart and electrically connected to one another by said plurality of circuit traces, each light emitting diode of said plurality of light emitting diodes; emitting light in a distribution pattern having a higher intensity central portion and a lower intensity wide angle peripheral portion; and
   a cover disposed substantially over and protecting said heat sink, said dielectric coating, said plurality of circuit traces, and said plurality of light emitting diodes, said cover including at least one aperture corresponding to at least one light emitting diode of said plurality of light emitting diodes;
   wherein said at least one light emitting diode of said plurality of light emitting diodes is recessed behind said at least one aperture within said cover such that a gap exists between the at least one light emitting diode and said aperture in said cover, said at least one aperture being positioned in order to reduce glare such that said higher intensity central portion of light emitted from said at least one light emitting diode passes unobstructed through said at least one aperture and said lower intensity wide angle peripheral portion of light emitted by said at least one light emitting diode is directed toward an inner surface of the cover, said lamp assembly adapted to be electrically connected to a power source.

2. The lamp assembly of claim 1, wherein said heat sink is made of a material selected from a group consisting of aluminum, aluminum alloys, steel, stainless steel, copper, and combinations thereof.

3. The tamp assembly of claim 1, wherein said dielectric coating is a polymer/ceramic blend.

4. The lamp assembly of claim 1, wherein said dielectric coating is applied with a thixotropic material by screen printing.

5. The lamp assembly of claim 1, wherein said dielectric coating is between approximately one thousand microns and approximately ten microns thick.

6. The lamp assembly of claim 1, wherein said plurality of circuit traces are formed by a method selected from a group consisting of painting and dipping.

7. The lamp assembly of claim I wherein said plurality of circuit traces is disposed only over predetermined routes.

8. The lamp assembly of claim 1, wherein said plurality of circuit traces are comprised of a polymeric material having metal particles dispersed therein.

9. The lamp assembly of claim 8, wherein said polymeric material is selected from a group consisting of epoxy and phenolic resin.

10. The lamp assembly of claim 8, wherein said metal particles dispersed in said polymeric material are selected from a group consisting of silver, gold, copper, silver, nickel, and alloys thereof.

11. The lamp assembly of claim 1, wherein each of said plurality of light emitting diodes is selected from a group consisting of Luxeon 1 W emitter diodes, Luxeon 3 W emitter diodes, 1 W Jupiter diodes, 1 W XLamp diodes, 1 W Golden Dragon diodes, and Super-Flux HPA ⅛ W diodes.

12. The lamp assembly of claim 1, wherein each light emitting diode of said plurality of light emitting diodes is separated from each adjacent light emitting diode of said plurality of light emitting diodes by approximately one inch to six inches.

13. The lamp assembly of claim 1, wherein said cover is made of a substantially clear material selected from a group consisting of a polycarbonate and an acrylic plastic.

14. The lamp assembly of claim 1, wherein said cover is secured to said heat sink by fasteners, an adhesive, an epoxy, or a mechanical engagement selected from the group consisting of: a snap fit, an interference fit, and a locking mechanism between two extruded shapes.

15. The lamp assembly of claim 1, wherein said cover includes a lens such that light emitted from said plurality of light emitting diodes is redirected to be more evenly distributed as it passes through said cover.

16. The lamp assembly of claim 1, wherein said support structure functions as said cover.

17. An electrically driven light emitting diode lamp assembly at least partially housed within a vehicular support structure, said lamp assembly being low profile, providing general illumination having reduced glare to an interior space at least partially defined by said vehicular support structure and comprising:
an electrically and thermally conductive and entirely metal heat sink;
an electrically insulating coating disposed over said heat sink, said coating being less than approximately one thousand microns thick;
a plurality of circuit traces disposed along said coating, said plurality of circuit traces being spaced apart to prevent electrical conduction directly between each trace of said plurality of traces;
a plurality of light emitting diodes spaced apart and electrically connected to one another by said plurality of circuit traces, each light emitting diode of said plurality of light emitting diodes; emitting light in a distribution pattern having a higher intensity central portion and a lower intensity wide angle peripheral portion; each light emitting diode of said plurality of light emitting diodes having at least one electrical lead for providing an electrical connection to one or more of said plurality of circuit traces and secured to one of said plurality of circuit traces via an electrically conductive adhesive layer; and
a cover being disposed substantially over and protecting said heat sink, said coating, said plurality of circuit traces, and said plurality of light emitting diodes, said cover including at least one aperture corresponding to at least one light emitting diode of said plurality of light emitting diodes;
wherein said at least one light emitting diode of said plurality of light emitting diodes is recessed behind said at least one aperture within said cover such that a gap exists between the at least one light emitting diode and said aperture in said cover, said at least one aperture being positioned in order to reduce glare such that said higher intensity central portion of light emitted from said at least one light emitting diode passes unobstructed through said at least one aperture and said lower intensity wide angle peripheral portion of light emitted by said at least one light emitting diode is directed toward an inner surface of the cover;
wherein said assembly is adapted to be electrically connected to a power source and is installed directly within said support structure to provide general illumination in a substantially uniform manner to the interior space.

18. The lamp assembly of claim 17, wherein said heat sink is made of a material selected from a group consisting of aluminum, aluminum alloys, steel, stainless steel, copper, and combinations thereof.

19. The lamp assembly of claim 17, wherein said coating is made of a polymer/ceramic blend.

20. The lamp assembly of claim 17, wherein said coating is applied with a thixotropic material by screen printing.

21. The lamp assembly of claim 17, wherein said plurality of circuit traces are formed by a method selected from a group consisting of painting and dipping.

22. The lamp assembly of claim 17, wherein said plurality of circuit traces is disposed only over predetermined routes.

23. The lamp assembly of claim 17, wherein said plurality of circuit traces are comprised of a polymeric material having metal particles dispersed therein, said polymeric material being selected from a group consisting of an epoxy and a phenolic resin, and wherein said metal particles dispersed therein are selected from a group consisting of silver, gold, copper, silver, nickel, and alloys thereof.

24. The lamp assembly of claim 17, wherein each of said plurality of LEDs is selected from a group consisting of Luxeon 1 W emitter diodes, Luxeon 3 W emitter diodes, 1 W Jupiter diodes, 1 W XLamp diodes, 1 W Golden Dragon diodes, and Super-FLux HPA ⅛ W diodes.

25. The lamp assembly of claim 17, wherein each light emitting diode of said plurality of light emitting diodes is separated from each adjacent light emitting diode of said plurality of light emitting diodes by approximately to one to six inches.

26. The lamp assembly of claim 17, wherein said cover is made of a substantially clear material selected from a group consisting of a polycarbonate and an acrylic plastic.

27. The lamp assembly of claim 17, wherein said cover is secured to said heat sink by fasteners, an adhesive, an epoxy, or a mechanical engagement selected from the group consisting of: a snap fit, an interference fit, and a locking mechanism between two extruded shapes.

28. The lamp assembly of claim 17, wherein said cover includes a lens such that light emitted from said plurality of light emitting diodes is redirected to be more evenly distributed as it passes through said cover.

29. The lamp assembly of claim 17, wherein said support structure functions as said cover.

30. A low profile lamp assembly for providing reduced glare illumination, at least partially housed within an interior support structure of a truck trailer, said lamp assembly comprising:
a heat sink, said heat sink being made of an electrically and thermally conductive material;
an electrically insulating dielectric coating disposed on said heat sink, said dielectric coating being between approximately ten and one-thousand microns thick;
a plurality of circuit traces disposed on said dielectric coating;
a plurality of light emitting diodes electrically connected to each other by said plurality of circuit traces for producing a level of illumination between 50 and 200 Lux, each light emitting diode of said plurality of light emitting diodes being spaced from each adjacent light emitting diode of said plurality of light emitting diodes by approximately one to six inches, each light emitting diode of said plurality of light emitting diodes having at least one electrical lead for providing an electrical connection to one or more of said plurality of circuit traces and being secured to one of said plurality of circuit traces by an electrically conductive adhesive; and each light emitting diode of said plurality of light emitting diodes emitting light in a distribution pattern having a higher intensity central portion and a lower intensity wide angle peripheral portion; and a cover disposed substantially over and protecting said heat sink, said dielectric coating, said plurality of circuit traces, and said plurality of light emitting diodes; wherein each light emitting diode of said plurality of light emitting diodes is recessed behind said cover such that a gap exists between the at least one light emitting diode and said aperture in said cover; said at least one aperture being positioned in order to reduce glare such that said higher intensity central portion of light emitted from said at least one light emitting diode passes unobstructed through said at least one aperture and said lower intensity wide angle peripheral portion of light emitted by said at least one light emitting diode is directed toward an inner surface of the cover; and wherein said lamp assembly is adapted to be electrically connected to a power source for providing general illumination in a substantially uniform manner to an interior of the truck trailer.

31. The lamp assembly of claim 30, wherein said heat sink is made of a material selected from a group consisting of aluminum, aluminum alloys, steel, stainless steel, copper, and combinations thereof.

32. The lamp assembly of claim 30, wherein said dielectric coating is made of a polymer/ceramic blend.

33. The lamp assembly of claim 30, wherein said dielectric coating is applied with a thixotropic material by screen printing.

34. The lamp assembly of claim 30, wherein said plurality of circuit traces are formed by painting or dipping.

35. The lamp assembly of claim 30, wherein said plurality of circuit traces is disposed only over predetermined routes.

36. The lamp assembly of claim 30, wherein said plurality of circuit traces are comprised of a polymeric material having metal particles dispersed therein, said polymeric material being selected from a group consisting of an epoxy and a phenolic resin, and wherein said metal particles dispersed therein are selected from a group consisting of silver, gold, copper, silver, nickel, and alloys thereof.

37. The lamp assembly of claim 30, wherein each of said plurality of light emitting diodes is selected from a group consisting of Luxeon 1 W emitter diodes, Luxeon 3 W emitter diodes, 1 W Jupiter diodes, 1 W XLamp diodes, 1 W Golden Dragon diodes, and Super-FLux HPA ⅛ W diodes.

38. The lamp assembly of claim 30, wherein said cover is made of a substantially clear material selected from a group consisting of a polycarbonate and an acrylic plastic.

39. The lamp assembly of claim 30, wherein said cover is secured to said heat sink by fasteners, an adhesive, an epoxy, or a mechanical engagement such as a snap lit, an interference fit, or a locking mechanism between two extruded shapes.

40. The lamp assembly of claim 30, wherein said support structure further acts as said cover, said support structure including at least one aperture corresponding to at least one light emitting diode of said plurality of light emitting diodes.

41. The lamp assembly of claim 30, wherein said cover includes a lens, such that light emitted from said plurality of light emitting diodes is redirected to be more evenly distributed as it passes through said cover.

42. A system for generally illuminating an interior space of a vehicle with reduced glare, said system comprising:
   a vehicular support structure having a plurality of structural elements which at least partially define the interior space; and
   a low profile lamp assembly, said lamp assembly including:
      a heat sink;
      an electrically insulating dielectric coating disposed on said heat sink;
      a plurality of circuit traces disposed on said dielectric coating;
      a plurality of light emitting diodes spaced one to six inches apart and electrically connected to one another by said plurality of circuit traces; and each light emitting diode of said plurality of light emitting diodes emitting light in a distribution pattern having a higher intensity central portion and a lower intensity wide angle peripheral portion; and
      wherein said structural elements function as a cover disposed substantially over and protecting said heat sink, said dielectric coating, said plurality of circuit traces, and said plurality of light emitting diodes,
      wherein said cover has least one aperture formed therein to allow light from said plurality of light emitting diodes to be emitted so as to illuminate said interior space in a substantially uniform manner;
      wherein each light emitting diode of said plurality of light emitting diodes recessed behind an aperture of the plurality of apertures within the cover such that a gap exists between the at least one light emitting diode and said aperture in said cover, each aperture being positioned in order to reduce glare such that said higher intensity central portion of light emitted from said light emitting diode passes unobstructed through said aperture and the lower intensity wide angle peripheral portion of light emitted by the light emitting diode is directed toward an inner surface of the cover;
      wherein said structural elements function as a cover disposed substantially over and protecting said heat sink, said dielectric coating, said plurality of circuit traces, and said plurality of light emitting diodes,
      wherein said cover having said at least one aperture formed therein allows light from said plurality of light emitting diodes to be emitted so as to illuminate said interior space in a substantially uniform manner.

43. The system of claim 42, wherein said lamp assembly is adapted to be electrically connected to a power source within a truck.

44. The system of claim 42, wherein said heat sink is made of a material selected from a group consisting of aluminum, aluminum alloys, steel, stainless steel, copper, and combinations thereof.

45. The system of claim 42, wherein said dielectric coating is made of a polymer/ceramic blend.

46. The system of claim 42, wherein said dielectric coating is applied with a thixotropic material by screen printing.

47. The system of claim 42, wherein said dielectric coating is between approximately ten and one-thousand microns thick.

48. The system of claim 42, wherein said plurality of circuit traces are formed by painting or dipping.

49. The system of claim 42, wherein said quality of circuit traces is disposed only over predetermined routes.

50. The system of claim 42, wherein said plurality of circuit traces are comprised of a polymeric material having metal particles dispersed therein, said polymeric material being selected from a group consisting of an epoxy and a phenolic resin, and wherein said metal particles dispersed therein are selected from a group consisting of silver, gold, copper, silver, nickel, and alloys thereof.

51. The system of claim 42, wherein each of said plurality of LEDs is selected from a group consisting of Luxeon 1 W emitter diodes, Luxeon 3 W emitter diodes, 1 W Jupiter diodes, 1 W XLamp diodes, 1 W Golden Dragon diodes, and Super-FLux HPA ⅛ W diodes.

52. The system of claim 42, wherein said lamp assembly further includes a lens so that light emitted from said plurality of light emitting diodes is redirected to be more evenly distributed.

53. The lamp assembly of claim 1 wherein a diameter of the aperture is approximately equal to a diameter of the LED.

54. The lamp assembly of claim 17 wherein a diameter of the aperture is approximately equal to a diameter of the LED.

55. The lamp assembly of claim 30 wherein a diameter of the aperture is approximately equal to a diameter of the LED.

56. The lamp assembly of claim 42, wherein a diameter of the aperture is approximately equal to a diameter of the LED.

\* \* \* \* \*